United States Patent [19]

Gasparik

[11] Patent Number: 5,801,564
[45] Date of Patent: Sep. 1, 1998

[54] REDUCED SKEW DIFFERENTIAL RECEIVER

[75] Inventor: Frank Gasparik, Monument, Colo.

[73] Assignee: Symbios, Inc.

[21] Appl. No.: 671,850

[22] Filed: Jun. 28, 1996

[51] Int. Cl.$^6$ .................................. H03F 3/45; H03K 5/12
[52] U.S. Cl. .................. 327/170; 327/112; 327/333; 327/374; 327/563; 330/255; 330/257
[58] Field of Search .................................. 330/257, 255, 330/253; 327/410, 409, 408, 407, 170, 437, 65, 66, 560, 561, 562, 563, 112, 374, 376, 377, 333

[56] References Cited

U.S. PATENT DOCUMENTS

| | | | |
|---|---|---|---|
| 4,152,663 | 5/1979 | Van De Sande | 330/253 |
| 4,766,394 | 8/1988 | Yukawa | 330/253 |
| 5,065,055 | 11/1991 | Reed . | |
| 5,142,244 | 8/1992 | Glica et al. | 330/253 |
| 5,187,448 | 2/1993 | Brooks et al. | 330/258 |
| 5,248,946 | 9/1993 | Murakami et al. | 330/253 |
| 5,291,149 | 3/1994 | Nunoshima | 330/255 |
| 5,323,120 | 6/1994 | Ryat | 330/252 |
| 5,374,859 | 12/1994 | Doyle et al. | 327/65 |
| 5,422,529 | 6/1995 | Lee | 327/536 |
| 5,451,898 | 9/1995 | Johnson | 327/563 |
| 5,471,498 | 11/1995 | Kuo | 375/295 |
| 5,491,455 | 2/1996 | Kuo | 330/253 |
| 5,574,401 | 11/1996 | Spitalny | 330/253 |

FOREIGN PATENT DOCUMENTS

| | | | |
|---|---|---|---|
| 611288 | 6/1978 | U.S.S.R. | 330/255 |

OTHER PUBLICATIONS

Fisher, "A High-Performance CMOS Power Amplifier", IEEE Journal of Solid-State Circuits, vol. SC-20, No. 6; pp. 1200–1204, Dec. 1985.

*Primary Examiner*—Timothy P. Callahan
*Assistant Examiner*—Terry L. Englund
*Attorney, Agent, or Firm*—Wayne P. Bailey

[57] ABSTRACT

A differential receiver that includes a first input, a second input, and an output has a first signal path from the first input to the output, the first signal path including a first differential amplifier and a first active load. The first differential amplifier has an end connected to a first power supply voltage and a second end connected to a second power supply voltage and the first active load. The first differential amplifier also has a connection to the first input and the second input, and the first active load has a connection to the output. The receiver also has a second signal path from the second input to the output, the second signal path including a second differential amplifier and a second active load. The second differential amplifier has an end connected to a first power supply voltage and a second end connected to a second power supply voltage and the second active load. The second differential amplifier has a connection to the first input and the second input, and the second active load has a connection to the output. The first signal path and the second signal path both have the same number of devices and are configured to minimize skew at the output to less than about one nanosecond.

30 Claims, 4 Drawing Sheets

REDUCED SKEW DIFFERENTIAL RECEIVER

BACKGROUND OF THE INVENTION

1. Technical Field

The present invention relates generally to differential receivers and in particular to differential receivers for receiving high speed low voltage signals. Still more particularly, the present invention relates to differential receivers for receiving high speed low voltage signals with minimized delay skew.

2. Description of the Related Art

Differential receivers for high speed, low voltage differential signaling (LVDS) applications require symmetric, low delay skew responses for a wide range of common mode and differential input signals. With these two conditions, the skew will vary due to faster propagation of one signal edge. Skew is the difference between a low-to-high transition delay (to) and high-to-low transition delay ($t_{HL}$), i.e. skew$^+$ =$t_{LH}$-$t_{HL}$ or skew$^-$=$t_{HL}$-$t_{LH}$.

In FIG. 1, a typical implementation of a differential receiver with an active load is illustrated. Receiver 100 includes negative input 102 and positive input 104 along with an output 106. The input differential pair of transistor 108 and transistor 110 drives a current mirror containing transistor 112 and transistor 114. This current mirror in turn drives the gate of transistor 116, which is an output device connected to output 106. Transistors 108 and 110 are n-channel metal-oxide-semiconductor (MOS) transistors while transistors 112–116 are p-channel MOS transistors. Additionally, receiver 100 includes transistors 118 and 120, which are n-channel MOS transistors. Current sources 122 and 124 also are found in receiver 100. Receiver 100 is powered by connections to a first power supply voltage and a second power supply voltage in which the first power supply voltage is an upper power supply voltage VDD and the second power supply voltage is a lower power supply voltage, such as for example, ground.

A low-to-high (LH) rising signal edge propagates faster than the falling edge of a high-to-low (HL) of the output signal. The LH rising edge of the input signal quickly pulls down the gate of transistor 116 and drives the output at output 106 high with very little delay. In contrast, the falling edge of the output signal at output 106 encounters more delay because as the input signal undergoes the HL transition, transistor 110 is being turned off. Through the action of the current mirror including transistors 112 and 114, transistor 116 is turned off by the rising voltage on its gate. This delay is caused by the mirroring effect from transistor 112 to transistor 114 and will always cause a larger delay for an HL transition. The difference in LH and HL propagation delays results in a delay skew in receiver 100 for the high output state.

A further problem exists with using a constant current source at transistor 116 for the output pull-down is a constant power dissipation during the output at output 106 being in a high logic state. For a fast output pull-down, the current of transistor 120 has to be large and causes a large static power dissipation in receiver 100.

Turning next to FIG. 2, a more symmetrical implementation of a receiver known in the art is depicted. In this case, receiver 200 includes a negative input 202 and a positive input 204 along with an output 206. Receiver 200 contains a differential pair of transistors 208 and 210, which drives symmetric diode-connected transistors 214 and 216. These two transistors serve as an active load for the differential pair of transistors 202 and 204. In this depicted circuit, the delay path, formed by transistors 216 and 218, for a LH transition is shorter than the delay path around the loop consisting of transistors 214, 220, 222, and 224 for HL transitions. Receiver 200 illustrates a skew problem for a small differential input signal centered around a common mode equal to about one-half of a VDD power supply voltage. The LVDS specifications require that the receiver guarantees very small skew for a specified range of differential input voltage (e.g. from about 70 mV to about 400 mV) and for large common-mode voltage ranges (e.g., from about 0.7 V to about 1.8 V) for a power supply voltage VDD equalling about 3.3 volts plus or minus five percent.

The input overdrive will speed up the LH transition more than the HL transition and thus increase the skew. The common mode voltage will have similar and more severe effects upon the skew problems due to the changing operating conditions of the input and active load devices. Thus, it would be advantageous to have an improved receiver in which skew is reduced.

SUMMARY OF THE INVENTION

The present invention provides a differential receiver that includes a first input, a second input, and an output. The receiver has a first signal path from the first input to the output, the first signal path including a first differential amplifier and a first active load. The first differential amplifier has an end connected to a first power supply voltage and a second end connected to a second power supply voltage and the first active load. The first differential amplifier also has a connection to the first input and the second input, and the first active load has a connection to the output. The receiver also has a second signal path from the second input to the output, the second signal path including a second differential amplifier and second active load. The second differential amplifier has an end connected to a first power supply voltage and a second end connected to a second power supply voltage and the second active load. The second differential amplifier has a connection to the first input and the second input, and the second active load has a connection to the output. The first signal path and the second signal path both have the same number of devices and are configured to minimize skew at the output to less than about one nanosecond.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
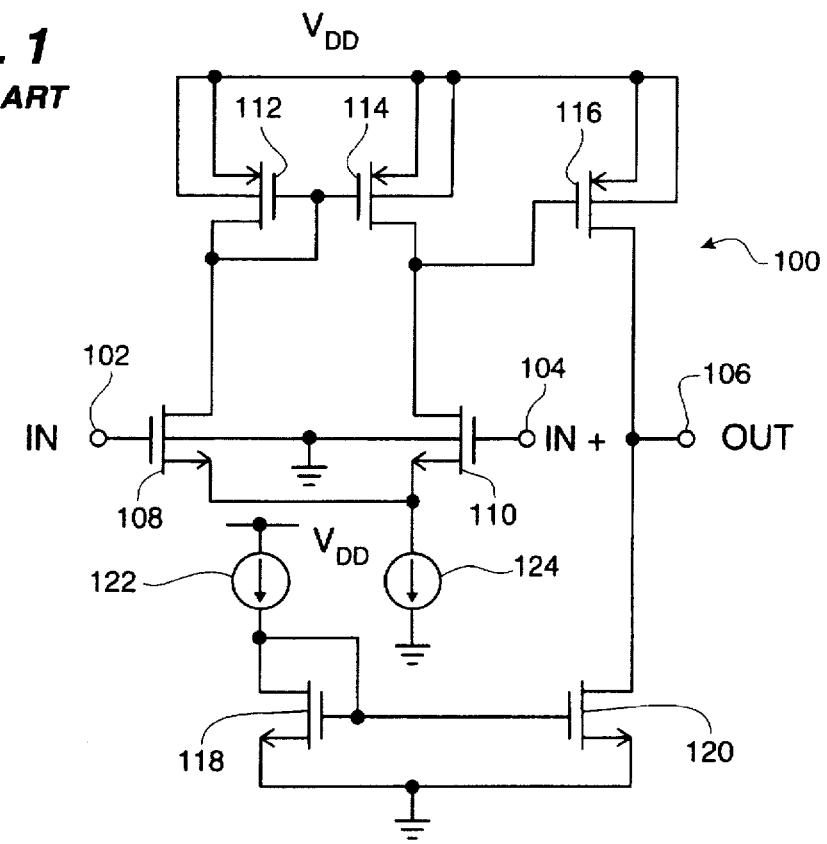
FIG. 1 is a typical implementation of a differential receiver with an active load.
Figure 2:
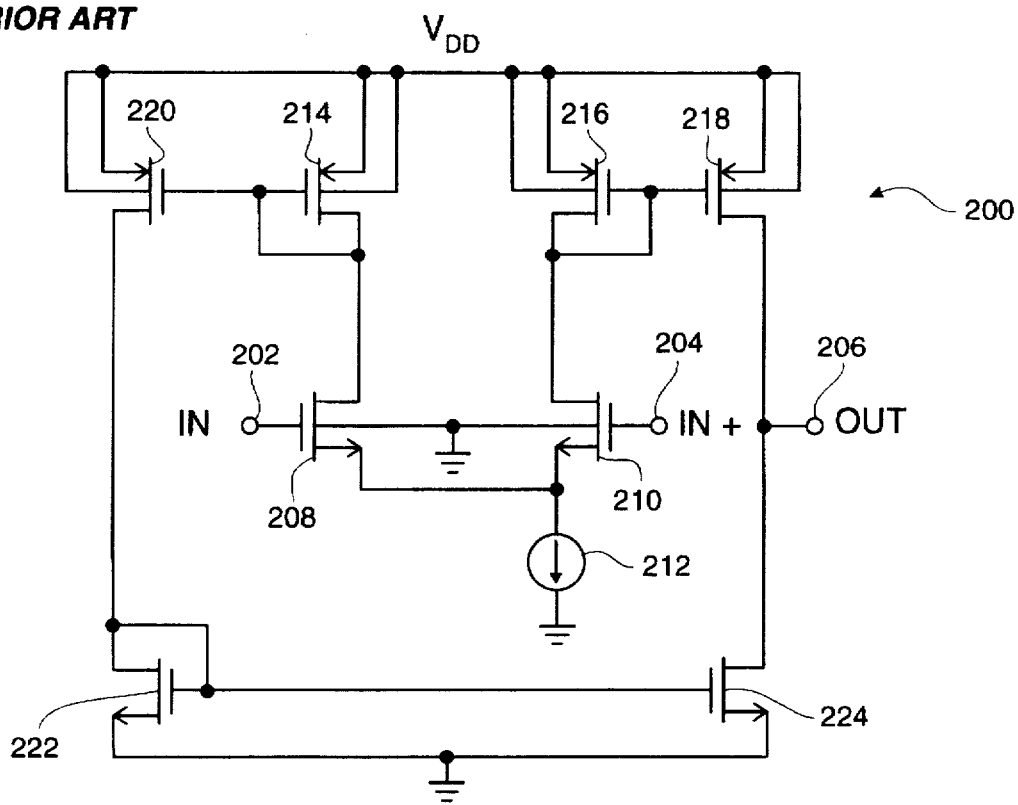
FIG. 2 is a more symmetrical implementation of a receiver known in the art.
Figure 3:
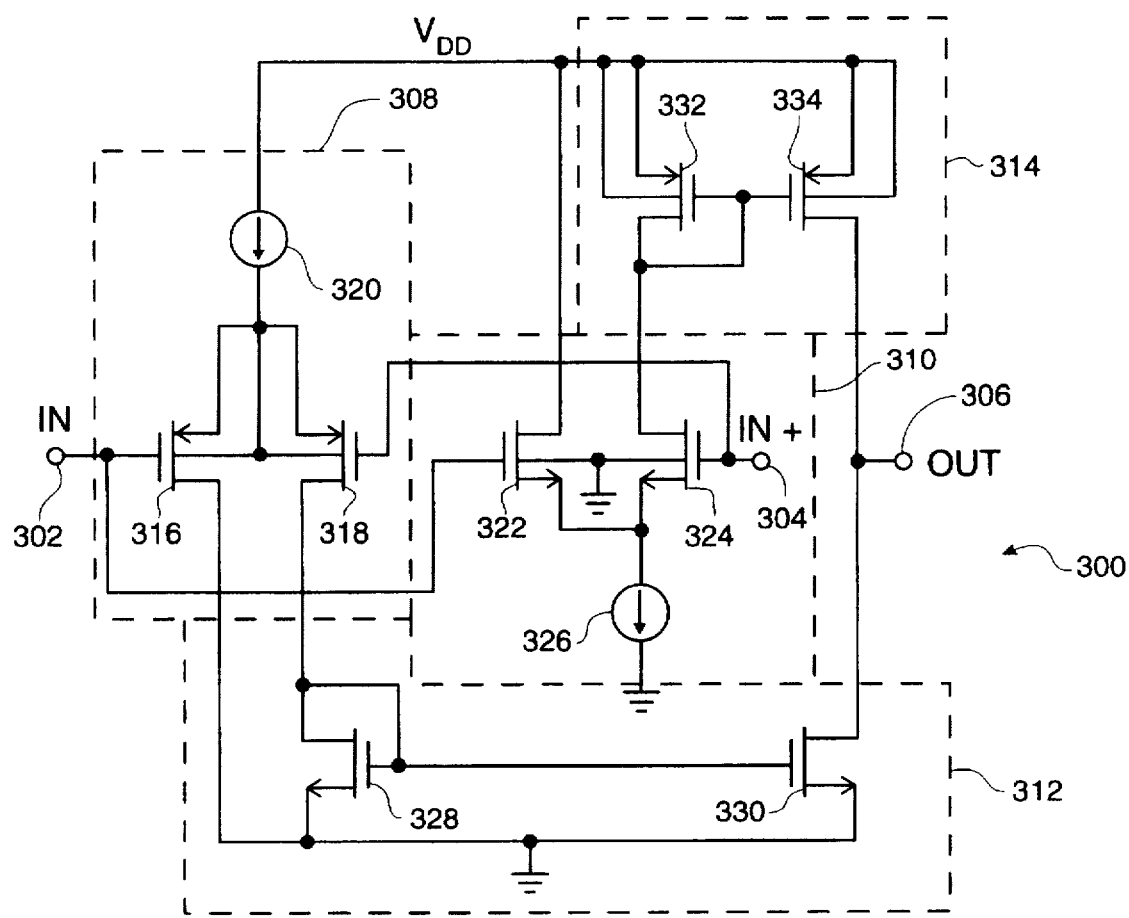
FIG. 3 is a schematic diagram of a receiver according to the present invention.

With reference now to the figures, and in particular with reference to FIG. 3, a schematic diagram of a receiver is depicted according to the present invention. FIG. 3 is a complementary metal oxide semiconductor (CMOS) implementation of the present invention. Receiver 300 in FIG. 3 includes a positive input 304, a negative input 302, and an output 306. Inputs 302 and 304 receive input signals while output 306 provides a signal that is delivered to another device or circuit. Receiver 300 also includes a differential amplifier 308, a differential amplifier 310, an active load 312, and an active load 314. The differential amplifiers produce currents, and the active loads are used to convert the currents into an output voltage at output 306. Receiver 300 is powered by a first power supply voltage and a second power supply voltage. The first power supply voltage is an upper power supply voltage (e.g., VDD), and the second power supply voltage is a lower power supply voltage (e.g., VSS or ground).

Differential amplifier 308 includes transistor 316, transistor 318, and a current source 320. In the depicted example, transistor 316 and transistor 318 are p-channel metal-oxide-semiconductor (MOS) transistors. Differential amplifier 310 includes transistor 322, transistor 324, and a current source 326. In the depicted example, transistor 322 and transistor 324 are n-channel metal-oxide-semiconductor (MOS) transistors. Active load 312 contains transistors 328 and 330 while active load 314 contains transistors 332 and 334. Transistors 328 and 330 are n-channel MOS transistors, while transistors 332 and 334 are p-channel MOS transistors. The gates of transistors 328 and 332 are tied to their drains such that transistors 328 and 330 and transistors 332 and 334 operate as current mirrors. Additionally, transistor 332 is a diode-connected transistor. The devices in differential amplifier 308 and active load 312 form a first signal path from inputs 302 and 304 to output 306, while the devices in differential amplifier 310 and active load 314 form a second signal path from inputs 302 and 304 to output 306. The devices in differential amplifier 310 and active load 314 are used in LH voltage transitions at output 306, and the devices in differential amplifier 308 and active load 312 are used in HL voltage transitions at output 306. LH voltage transitions occur at output 306 in response to signals applied at inputs 302 and 304 having a positive potential difference. HL voltage transitions occur at output 306 in response to signals applied at inputs 302 and 304 having a negative potential difference.

As can be seen, two differential input pairs (transistors 316 and 318 and transistors 322 and 324) are employed. Transistors 316 and 318 drive transistor 330 directly through transistor 328, which is a diode-connected transistor. Similarly, transistors 322 and 324 drive transistor 334 directly through transistor 332.

According to the present invention, both signal paths for generating LH and HL voltage transitions have a smaller number of devices than in present receiver configurations. Additionally, according to the present invention, an identical number of devices are present in both in signal paths, and both differential amplifiers drive the output devices directly. Additionally, the present invention provides another advantage in that no static power dissipation occurs in the output stage formed by transistors 330 and 334. Thus, the present invention provides a high speed receiver that operates over a specified range of common mode voltages and differential input signals as required in low voltage differential signaling technology while minimizing skew between rising and falling edges of the output signal.

Figure 4:
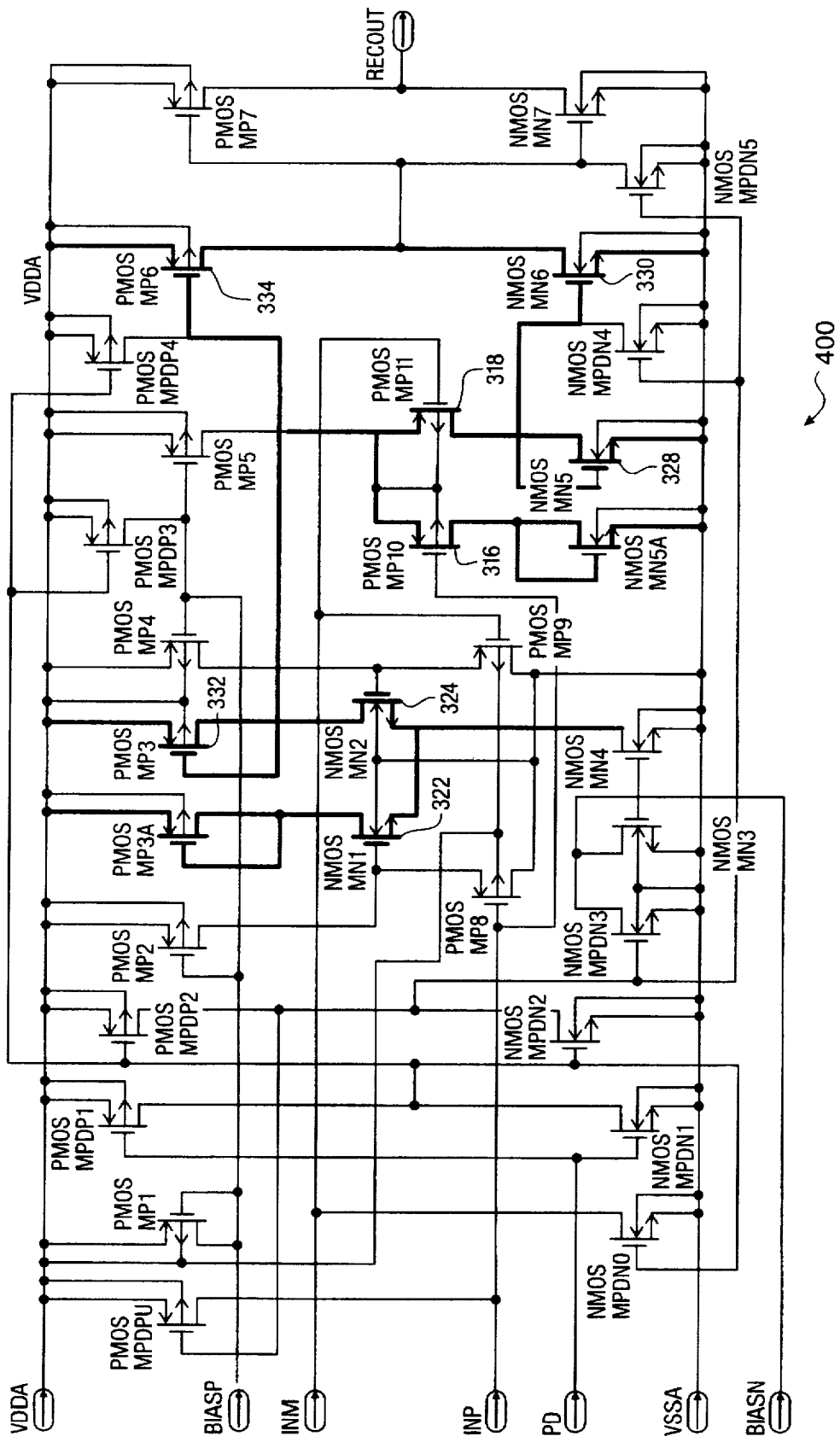
FIG. 4 is a more detailed schematic diagram of receiver 300 in FIG. 3 according to the present invention.

With reference now to FIG. 4, a more detailed schematic diagram of receiver 300 in FIG. 3 is depicted according to the present invention. Reference numbers repeated from FIG. 3 in FIG. 4 refer to the same transistors in these two figures. Current source 320 in FIG. 3 corresponds to a current mirror consisting of diode-connected p-channel transistor MP1 and p-channel transistor MP5. Similarly, current source 326 is implemented by a current mirror consisting of diode-connected n-channel transistor MN3 and n-channel transistor MN4. Transistor MP3A is connected to transistor 322 to add a matching active load device to transistor 332. Similarly, transistor MN5A has been connected to transistor 316 to provide a matching active load device to transistor 328.

Terminal VDDA provides an upper power supply voltage to receiver 400 while terminal VSSA provides a lower power supply voltage.

Terminals BIASP and BIASN are employed in level shifting of receiver 400. Transistors MP8 and MP9 along with their respective sources, transistors MP2 and MP4 serve as level shifters for transistors 322 and 324 to accommodate a common mode input range from about 0.7 V to about 1.8 V. Transistors NPDN1–NPDN5, which are n-channel transistors, and transistors NPDP1–NPDP4, which are p-channel transistors, are employed during power-down of receiver 400 using terminal PD. Transistors MN3 and MN4 are n-channel transistors while transistors MP1, MP2, MP4, and MP5 are p-channel transistors. These transistors are also used during power-down of receiver 400. Transistors MP7 and MN7 form an output buffer employed to drive a load connected to terminal RECOUT. Transistors NPDN0 and MPPU are used for bringing input INM to a low state and input INP to a high state to minimize noise and to prevent oscillation in case of floating inputs.

The receivers depicted in FIGS. 3 and 4 may be employed in circuits having differential inputs and a single ended output. In particular, the receiver of the present invention may be implemented in devices such as, for example, operational amplifier and comparators.

Figure 5:
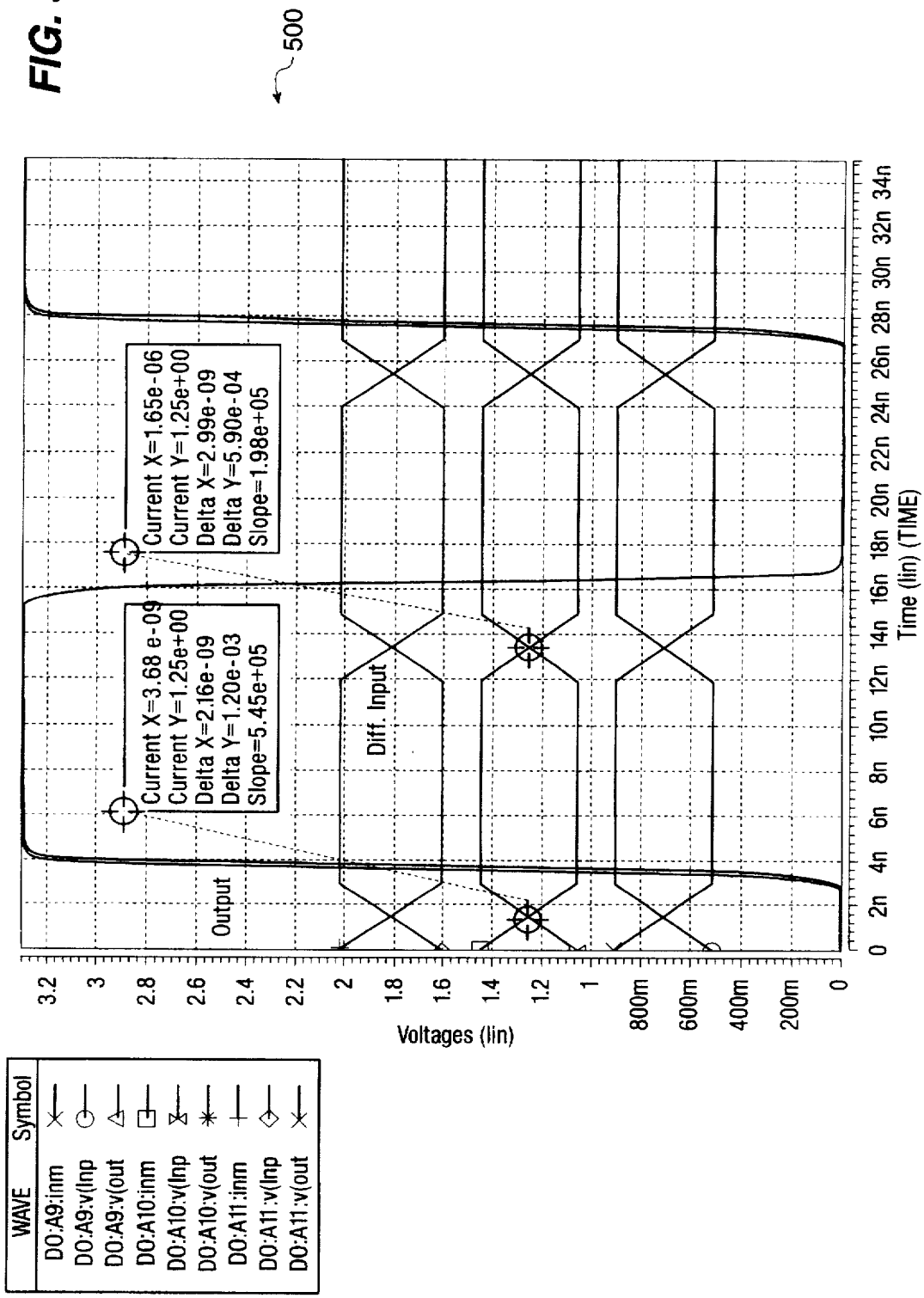
FIG. 5 is a diagram of input and output signals from the receiver in FIG. 4 according to the present invention.

With reference now to FIG. 5, a diagram of input and output signals from a receiver is depicted according to the present invention. Diagram 500 is a diagram of an HSpice simulation of the receiver depicted in FIG. 4. The skew is the difference between the low-to-high ($t_{PLH}$) and the high-to-low ($t_{PHL}$) output delay. In the depicted example, the delay for the LH transition is $t_{PLH}$=2.18 ns, and the delay for the HL transition $t_{PHL}$=2.99 ns, resulting in a skew less than 1 nanosecond; skew is equal to 0.81 ns. The depicted example employs three input/output cases for three common-mode levels of the input (0.7 V, 1.25 V, and 1.8 V). As can be seen, the low amount of skew is achieved by making the two signal paths from the input to the output for HL and LH voltage transitions equal and as short as possible. In the depicted example, the differential receiver maintains this low skew for a differential input signal range from approximately 70 mV to greater than 400 mV. The common mode range achieved by the depicted example is from about 0.7 V to about 1.8 V as required by IEEE Standard SPI-2 for SCSI Low Voltage Differential interface.

Thus, the present invention provides an improved high speed receiver capable of operating over a specified range of common mode voltages and differential input signals with minimized skew between rising and falling edges of the output signal. These advantages are provided by employing signal paths from the inputs to the output for HL and LH transitions that are equal in length and as short as possible.

While the invention has been particularly shown and described with reference to a preferred embodiment, it will be understood by those skilled in the art that various changes in form and detail may be made therein without departing from the spirit and scope of the invention.

What is claimed is:

1. An apparatus for receiving input signals and generating an output signal comprising:
   a first input configured to receive a first signal;
   a second input configured to receive a second signal;
   an output;
   a first signal path having a first end connected to the first input and the second input and a second end connected to the output, wherein the first signal path includes a first number of devices and generates a first transition in the output signal generated at the output in response to a first type of potential difference between the first signal received at the first input and the second signal received at the second input; and
   a second signal path having a first end connected to the first input and the second input and a second end connected to the output, wherein the second signal path includes a second number of devices equal in number to the first number of devices and generates a second transition in the output signal generated at the output in response to a second type of potential difference between the first signal received at the first input and the second signal received at the second input,
   wherein the devices within the first signal path and the second signal path are configured to limit skew between the first type of transition and the second type of transition of the output signal at the output to less than about one nanosecond.

2. The apparatus of claim 1, wherein the first signal path and the second signal path each include a differential amplifier.

3. The apparatus of claim 2, wherein the first signal path and the second signal path each include an active load.

4. The apparatus of claim 1, wherein the first type is a positive potential difference and the first transition is a low-to-high transition.

5. The apparatus of claim 4, wherein the second type is a negative potential difference and the second transition is a high-to-low transition.

6. A differential receiver comprising:
   a first input;
   a second input;
   an output;
   a first p-channel transistor, a second p-channel transistor, and a first current source including a first current mirror, the first p-channel transistor and second p-channel transistor each having a gate, a drain, and a source, the first current source having a first terminal connected to the source of the first p-channel transistor and the source of the second p-channel transistor and a second terminal connected to a first power supply voltage, the gate of the first p-channel transistor being connected to the first input and the gate of the second p-channel transistor being connected to the second input, wherein the first p-channel transistor, the second p-channel transistor, and the first current source form a first differential amplifier;
   a first n-channel transistor, a second n-channel transistor, and a second current source including a second current mirror, the first n-channel transistor and second n-channel transistor each having a gate, a drain, and a source, the second current source having a first terminal connected to the course of the first n-channel transistor and the source of the second n-channel transistor and a second terminal connected to a second power supply voltage, the gate of the first n-channel transistor being connected to the first input and the gate of the second n-channel transistor being connected to the second input, wherein the first n-channel transistor, the second n-channel transistor, and the second current source form a second differential amplifier;
   a third n-channel transistor and a fourth n-channel transistor, the third n-channel transistor and the fourth n-channel transistor each having a gate, a drain, and a source, the third n-channel transistor being a diode-connected transistor, the source of the third n-channel transistor and the source of the fourth n-channel transistor being connected to the second power supply voltage, the gate of the third n-channel transistor being connected to the gate of the fourth n-channel transistor, the drain of the third n-channel transistor being connected to the gate of the third n-channel transistor and to the drain of the second p-channel transistor, the drain of the fourth n-channel transistor being connected the output, the third n-channel transistor and the fourth n-channel transistor forming a first active load; and
   a third p-channel transistor and a fourth p-channel transistor, the third p-channel transistor and the fourth p-channel transistor each having a gate, a drain, and a source, the third p-channel transistor being a diode connected transistor, the source of the third p-channel transistor and the source of the fourth p-channel transistor being connected to the first power supply voltage, the gate of the third p-channel transistor being connected to the gate of the fourth p-channel transistor, the drain of the third p-channel transistor being connected to the gate of the third p-channel transistor and to the drain of the second n-channel transistor, the drain of the fourth p-channel transistor being connected to the output, the third p-channel transistor and the fourth p-channel transistor forming a second active load,
   wherein the first and second differential amplifiers and the first and second active loads are configured to limit skew between a first type of transition at the output and a second type of transition at the output to less than about one nanosecond.

7. The differential receiver of claim 6, wherein the first power supply voltage is an upper power supply voltage and the second power supply voltage is a lower power supply voltage.

8. The differential receiver of claim 7, wherein the upper power supply voltage is VDD.

9. The differential receiver of claim 7, wherein the lower power supply voltage is a ground voltage.

10. The differential receiver of claim 6, wherein the first p-channel transistor and the second p-channel transistor drive the fourth n-channel transistor directly and the first n-channel transistor and the second n-channel transistor drive the fourth p-channel transistor directly to generate a signal at the output.

11. The differential receiver of claim 6, wherein the first input is a negative input.

12. The differential receiver of claim 11, wherein the second input is a positive input.

13. A differential receiver comprising:
   a first input;
   a second input;
   an output;
   a first signal path from the first input to the output, the first signal path including:
      a first differential amplifier including a current mirror; and
      a first active load including a current mirror, wherein the first differential amplifier has a first terminal connected to a first power supply voltage and a second terminal connected to a second power supply voltage and a third terminal connected to the first active load and wherein the first differential amplifier has a connection to the first input and the second input and the first active load has a connection to the output; and
   a second signal path from the second input to the output, the second signal path including:
      a second differential amplifier including a current mirror; and
      a second active load including a current mirror, wherein the second differential amplifier has a first terminal connected to the second power supply voltage and a second terminal connected to the first power supply voltage and a third terminal connected to the second active load and wherein the second differential amplifier has a connection to the first input and the second input and the second active load has a connection to the output,
   wherein the first signal path and the second signal path both have an equal number of devices and output devices in the first active load and the second active load are driven by the first differential amplifier and the second differential amplifier and the first and second signal paths are configured to limit skew between a first type of transition at the output and a second type of transition at the output to less than about one nanosecond.

14. The differential receiver of claim 13, wherein the first differential amplifier comprises a first transistor, a second transistor, and the first current mirror including a first current source, the first transistor and the second transistor each having a gate, a drain, and a source, the first current source having a first end connected to the source of the first transistor and the source of the second transistor and a second end connected to the first power supply voltage, the gate of the first transistor being connected to the first input and the gate of the second transistor being connected to the second input; and
   wherein the second differential amplifier comprises a third transistor, a fourth transistor, and the second current-mirror including a second current source, the third transistor and the fourth transistor each having a gate, a drain, and a source, the second current source having a first end connected to the source of the third transistor and the source of the fourth transistor and a second end connected to the second power supply voltage, the gate of the third transistor being connected to the first input and the gate of the fourth transistor being connected to the second input.

15. The differential receiver of claim 14, wherein the first transistor and the second transistor are p-channel metal-oxide-semiconductor transistors.

16. The differential receiver of claim 14, wherein the third transistor and the fourth transistor are n-channel metal-oxide-semiconductor transistors.

17. The receiver of claim 14, wherein the first active load comprises a fifth transistor and a sixth transistor, the fifth transistor and the sixth transistor each having a gate, a drain, and a source, the fifth transistor being a diode-connected transistor, the source of the fifth transistor and the source of the sixth transistor being connected to the second power supply voltage, the gate of the fifth transistor being connected to the gate of the sixth transistor, the drain of the fifth transistor being connected to the gate of the fifth transistor and to the drain of the second transistor, the drain of the sixth transistor being connected to the output; and
   wherein the second active load comprises a seventh transistor and an eighth transistor, the seventh transistor and the eighth transistor each having a gate, a drain, and a source, the seventh transistor being a diode-connected transistor, the source of the seventh transistor and the source of the eighth transistor being connected to the first power supply voltage, the gate of the seventh transistor being connected to the gate of the eighth transistor, the drain of the seventh transistor being connected to the gate of the seventh transistor and to the drain of the fourth transistor, the drain of the eighth transistor being connected the output.

18. The differential receiver of claim 17, wherein the fifth transistor and the sixth transistor are n-channel metal-oxide-semiconductor transistors.

19. The differential receiver of claim 17, wherein the seventh transistor and the eighth transistor are p-channel metal-oxide-semiconductor transistors.

20. The differential receiver of claim 13, wherein the first input is a negative input and the second input is a positive input.

21. The differential receiver of claim 13, wherein the first signal path causes a high-to-low voltage transition in a signal generated at the output.

22. The differential receiver of claim 13, wherein the second signal path causes a low-to-high voltage transition in a signal generated at the output.

23. A receiver comprising:
   a first input;
   a second input;
   an output, wherein high and low output voltages are generated by the output in response to input signals applied to the first input and the second input;
   a first differential amplifier and a second differential amplifier, each differential amplifier having a connection to the first input and a connection to the second input and the first differential amplifier having a number of devices identical to a number of devices within the second differential amplifier; and
   a first active load and a second active load, each active load having a connection to the output and the first active load having a number of devices identical to a number of devices within the second active load,
   wherein the first differential amplifier and the first active load are used to generate a high-to-low voltage transition at the output in response to a negative potential difference between the input signals applied to the first input and the second input and the second differential amplifier and the second active load are used to generate a low-to-high voltage transition in response to a positive potential difference between the input signals applied to the first input and the second input and wherein the devices within the first differential amplifier, the second differential amplifier, the first active load, and the second active load are configured to limit skew in the high-to-low voltage transition and the low-to-high voltage transition to less than about one nanosecond.

24. The receiver of claim 23, wherein the devices within the first differential amplifier include a differential pair of p-channel transistors.

25. The receiver of claim 24, wherein the first active load includes a pair of n-channel transistors configured as a current mirror.

26. The receiver of claim 23, wherein the second differential amplifier includes a differential pair of n-channel transistors.

27. The receiver of claim 26, wherein the second active load includes a pair of p-channel transistors configured as a current mirror.

28. The receiver of claim 23, wherein the receiver has a common mode input range from about 0.7 V to about 1.8 V.

29. The receiver of claim 23, wherein a potential difference between the input signals applied to the first input and the second input range from about 70 mV to about 400 mV.

30. A method for generating an output signal in a receiver, the method comprising:

connecting a first input to a first end of a signal path comprising a first differential amplifier including a first transistor, a second transistor, and a first current source, and a first active load including a device connected to an output; and connecting a second input to a first end of a second signal path comprising a second differential amplifier including a third transistor, a fourth transistor, and a second current source, and a second active load including a device connected to the output, wherein the second differential amplifier and the second active load have a number of devices identical to a number of devices in the first differential amplifier and the first active load and each device within the first differential amplifier, the second differential amplifier, the first active load, and the second active load are sized to limit skew within the receiver to less than about one nanosecond.

* * * * *